March 10, 1964 J. DIJKSTRA 3,124,760
TRANSISTOR AMPLIFIER WITH VARIABLE PEAK CLIPPING AND AGC
Filed Dec. 12, 1960
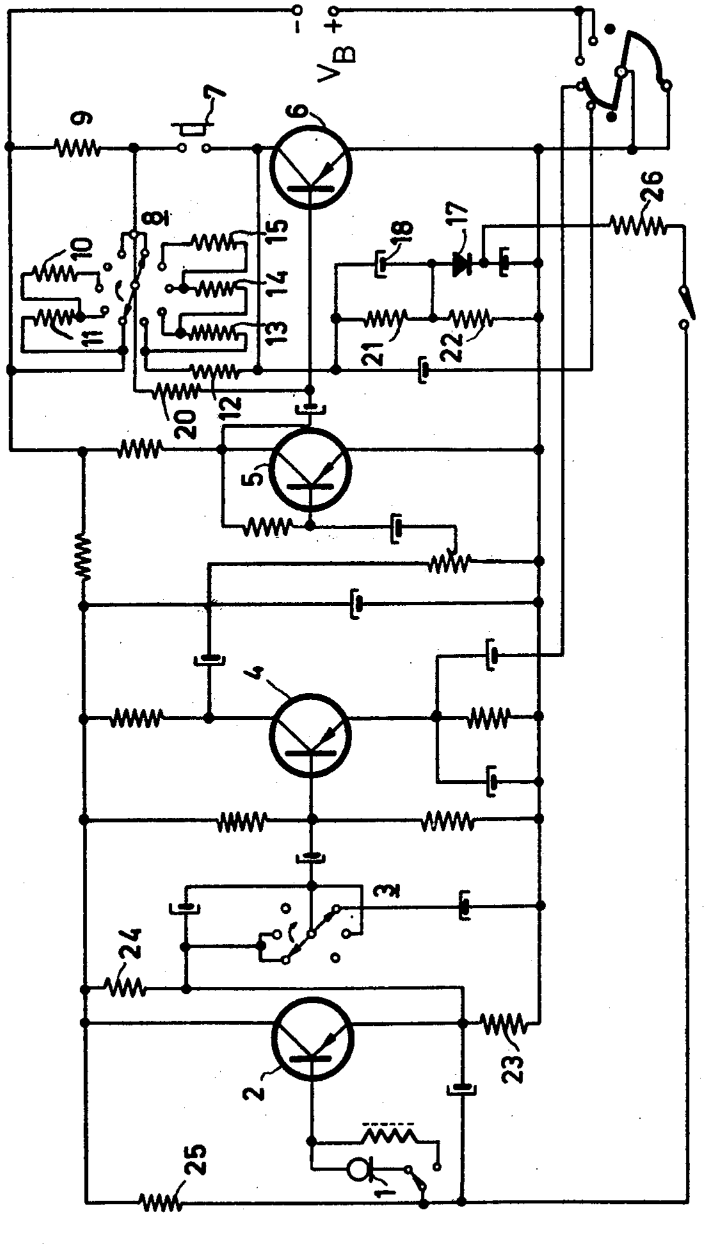
INVENTOR
JAN DIJKSTRA
BY Frank R. Jifari
AGENT

United States Patent Office 3,124,760
Patented Mar. 10, 1964

3,124,760
TRANSISTOR AMPLIFIER WITH VARIABLE PEAK CLIPPING AND AGC

Jan Dijkstra, Eindhoven, Netherlands, assignor to North American Philips Company, Inc., New York, N.Y., a corporation of Delaware Filed Dec. 12, 1960, Ser. No. 75,367
Claims priority, application Germany Jan. 27, 1960
7 Claims. (Cl. 330—29)

This invention relates to a transistor amplifying circuit arrangement, particularly to a low-power amplifier, for example, for use in hearing-aid apparatus. In such an amplifier usually the peaks of the oscillations are clipped so that the volume of the sound oscillations produced cannot exceed a given level. It is also known to provide, moreover, automatic gain control in accordance with the sound volume. The last-mentioned control brings about at least partial suppression of the harmonics effected by the clipping, since the sound oscillations are limited to a smaller range owing to this gain control.

The invention is characterized in that the peaks are clipped in known manner by a substantially symmetrical over-excitation of the last transistor of the amplifier and in that variable resistors are connected in series as well as parallel with the load, for example, the telephone or the loudspeaker in a manner such that the amplitude of the oscillations fed to a rectifier for producing the automatic gain control-voltage can exceed the clipping level to a material extent, when the resistors are adjusted to provide a lower value of this level.

Owing to the measure according to the invention it is ensured that with the adjustment to a lower clipping level the sensitivity of the automatic gain control remains substantially constant.

The invention will now be described more fully with reference to the embodiment shown in the drawing.

The hearing-aid apparatus comprises a microphone 1, a first transistor amplifier 2 with a tone-control 3, further transistor amplifiers 4, 5 and 6 and a load 7, for example, a telephone, a headphone, the earphone of hearing-aid glasses or the like.

The total resistance in the collector circuit of the last transistor 6 is proportioned so that excessively high signal peaks are clipped symmetrically by a correct adjustment of the base bias current by means of a resistor 20. In order to vary the peak clipping level provision is made of a switch 8 by means of which, in accordance with the invention, differently proportioned resistors 9, 10, 11 and 12, 13, 14, 15 can be switched in series and in parallel respectively with the load 7. A rectifier 17 to produce an automatic gain control of the first transistor 2 is connected via a blocking capacitor 18 to the collector of the transistor 6. By means of resistors 21, 22 a threshold voltage is introduced for the rectifier 17.

The arrangement operates as follows. The alternating voltage at the collector of the transistor 6 is capable of increasing, in the case of an ohmic load, to about half the supply voltage $V_B$ before the peak clipping becomes operative. The clipping becomes operative at a value which is the higher, the greater is the reactive component of the load impedance 7. The resistors 12 to 15 effect that the current then passing through the load 7 amounts to only a fraction of the collector current of the transistor 6. Consequently, the peak clipping level of the current passing through the load 7 can be varied by switching over the parallel resistors 12 to 15. This variation is accompanied, however, by a variation of the total resistance measured across the terminals of the load 7. An adjusting current supplied via the resistor 20 to the base of the transistor 6 then no longer corresponds to the correct value required to obtain a symmetrical clipping of the signals. In order to achieve this, the resistors 9 to 11 in series with the load 7 are switched over simultaneously with the switching-over of each of the resistors 12 to 15 in parallel with the load 7.

A calculation proves that correct symmetrical clipping is obtained with a purely ohmic load, if the condition: $R_{20}=\alpha' R_{9-11}+2\alpha' R_{7,\ 12-15}$ is fulfilled, in which $R_{20}$ designates the value of the resistor 20, $R_{9-11}$ the value of the series resistors 9, 10, 11, respectively concerned, $R_{7,\ 12-15}$ the resistance value of the parallel combination of the load 7 and of the parallel resistors 12, 13, 14, 15 respectively concerned and $\alpha'$ the collector-base current amplification factor of the transistor 6. It is achieved at the same time that the base bias current is adjusted to a lower value if the clipping level has been adjusted to a lower value.

A similar effect is obtained, when the load 7 is connected in parallel with the resistors 9–11 and the upper terminal of the resistor 20 is connected to the lower terminal instead of to the upper terminal of the load 7. In the case of a purely ohmic load 7 the condition $$R_{20}=\alpha'(R_{7,\ 9-11}+R_{12-15})$$

is to be fulfilled in order to obtain a symmetrical clipping of the peaks. However, the results of the arrangement shown in the figure are preferred owing to the lower current consumption and to the smaller negative signal feedback.

Use is furthermore made of the fact that, if the load 7 has an important reactive component, the direct voltage at the collector of the transistor 6 becomes lower (less negative) with an adjustment to a lower symmetrical clipping level, so that a lower threshold voltage is rendered operative via the resistors 21, 22 in the circuit of the rectifier 17. Consequently, the automatic gain control starts at a lower signal level.

The aforesaid conditions are fulfilled approximately within a given range by means of a single potentiometer, of which the partial resistances between the variable tapping and the terminals of the resistor body take over the function of the resistors 9–11 and 12–15 respectively. An improved approximation may be obtained by a suitable, non-linear variation of the resistance value with the place of the tapping and/or by switching in suitable bias resistors.

In a practical embodiment the following circuit elements were used:

| | | |
|---|---|---|
| Transistors: | | |
| 2 | | 0C58 |
| 4 | | 0C57 |
| 5 | | 0C59 |
| 6 | | 0C60 |
| Rectifier 17 | | 0A47 |
| Resistors: | | |
| 9 | ohms | 270 |
| 10 | do | 680 |
| 11 | do | 180 |
| 12 | do | 120 |
| 13 | do | 120 |
| 14 | do | 270 |
| 15 | do | 1000 |
| 20 | do | 27–39K |
| 21 | do | 2.2K |
| 22 | do | 15K |
| 23 | do | 1.8K |
| 24 | do | 2.2K |
| 25 | do | 120K |
| 26 | do | 22K |

| | |
|---|---|
| Capacitor 18 ____μf__ | 0.8 |
| Telephone 7: | |
| Ohms at 1000 c./s. ____ | 300 |
| Ohms at 0 c./s. ____ | 100 |
| Supply voltage ____v__ | 1.3 |
| Direct collector voltage ____v__ | 1 |

What is claimed is:

1. A transistor amplifier comprising a transistor having base, emitter and collector electrodes, collector circuit means connected to said collector electrode, a source of signals connected to said base electrode, means connecting said emitter electrode to a point of constant potential, said collector circuit comprising first variable resistor means in series with the parallel combination of load means and second variable resistor means, rectifier means, and means connecting said rectifier means to said collector electrode for producing an automatic gain control voltage.

2. The amplifier of claim 1, comprising bias resistor means connected between said base electrode and one end of said load means.

3. The amplifier of claim 2, wherein the resistance of said bias resistor is substantially equal to:

$$\alpha' R_1 + 2\alpha' R_2$$

where $\alpha'$ is the collector-base current amplification factor of the transistor, $R_1$ is the resistance of said first variable resistor means, and $R_2$ is the resistance of the parallel combination of said second variable resistor means and said load means, whereby said signals are substantially symmetrically clipped by said transistor.

4. A transistor amplifier comprising a transistor having base, emitter and collector electrodes, collector circuit means having one end connected to said collector electrode, a source of operating potential, means connecting said source of operating potential between the other end of said collector circuit means and said emitter electrode, a source of signals connected to said base electrode, said signals having sufficient amplitude to overdrive said transistor whereby said signals are peak clipped by said transistor, said collector circuit means comprising serially-connected simultaneously variable first and second resistance means and load means connected in parallel with said second resistance means, bias resistor means connected between said base electrode and the junction of said first and second resistance means, rectifier means, and means connecting said rectifier means to said collector electrode to produce an automatic gain control voltage.

5. A transistor peak clipping amplifier comprising a transistor having base, emitter and collector electrodes, a source of input signals connected to said base electrode, a source of operating potential having first and second terminals, means connecting said first terminal to said emitter electrode, first and second variable resistance means connected serially between said collector electrode and second terminal, reactive load means connected in parallel with one of said resistance means, bias resistor means connected between said base electrode and the junction of said first and second resistance means to provide base bias for said transistor for symmetrical clipping, whereby said base bias varies with variation of said first and second variable resistor means to maintain symmetrical clipping, rectifier means, and means connecting said rectifier means to said collector electrode for producing an automatic gain control voltage.

6. The amplifier of claim 5, in which one end of said second resistance means is connected to said collector electrode, and said load means is connected in parallel with said second resistance means.

7. A transistor amplifier comprising a transistor having base, emitter and collector electrodes, a source of input signals connected to said base electrode, a source of operating potential having first and second terminals, means connecting said first terminal to said emitter electrode, first and second variable resistor means serially connected in that order between said second terminal and said collector electrode, reactive load means connected in parallel with said second resistor means, base bias resistor means connected between said base electrode and the junction of said first and second resistor means for providing a base bias for said transistor that varies with the values of said first and second resistor means, and automatic control voltage producing means having a threshold that varies with the values of said first and second resistors, said control voltage producing means comprising third and fourth resistor means connected serially between said collector electrode and first terminal in that order, capacitor means connected in parallel with said third resistor means, an automatic gain control voltage output terminal, and rectifier means having one electrode connected to said output terminal and the other electrode connected to the junction of said third and fourth resistor means.

References Cited in the file of this patent

UNITED STATES PATENTS 2,898,411 Chow ____ Aug 4, 1959